United States Patent [19]

Hans

[11] Patent Number: 5,923,215
[45] Date of Patent: Jul. 13, 1999

[54] LINEARIZED AMPLIFIER

[75] Inventor: Ravinder Singh Hans, Littleton, Mass.

[73] Assignee: The Whitaker Corporation, Wilmington, Del.

[21] Appl. No.: 08/884,304

[22] Filed: Jun. 27, 1997

Related U.S. Application Data

[63] Continuation-in-part of application No. 08/662,548, Jun. 13, 1996, abandoned.

[51] Int. Cl.$^6$ .................................................. H03F 1/32
[52] U.S. Cl. ......................... 330/149; 330/132; 330/136; 330/279
[58] Field of Search .................................. 330/129, 132, 330/136, 149, 279

[56] References Cited

U.S. PATENT DOCUMENTS

| | | | |
|---|---|---|---|
| 4,647,872 | 3/1987 | Johnson | 330/311 |
| 4,683,443 | 7/1987 | Young et al. | 330/277 |
| 5,101,173 | 3/1992 | DiPiazza et al. | 330/136 |
| 5,144,266 | 9/1992 | Dougherty et al. | 333/1 |
| 5,331,291 | 7/1994 | D'Agostino et al. | 330/289 |
| 5,432,482 | 7/1995 | Bailey | 331/56 |
| 5,561,395 | 10/1996 | Melton et al. | 330/279 X |
| 5,710,519 | 1/1998 | McCalpin et al. | 327/538 |

OTHER PUBLICATIONS

Analysis and Design of Analog Integrated Circuits; Second Edition 1977, 1984; Paul R. Gray and Robert G. Meyer; 5 pages.

Primary Examiner—James B. Mullins

[57] ABSTRACT

A microprocessor detects input power and output power of a two transistor, Class AB amplifier, and provides an adapted bias level of the transistors which has been adapted from detected input power. The gain of the amplifier is maintained by the microprocessor depending upon the detected input power and frequency as well as detected output power.

3 Claims, 3 Drawing Sheets

LINEARIZED AMPLIFIER

CONTINUING DATA

The present application is a continuation-in-part of U.S. patent application Ser. No. 08/662,548 to Vassilakis et al, filed Jun. 13, 1996, now abandoned.

FIELD OF THE INVENTION

The invention relates to an amplifier with improved linearity characteristics.

BACKGROUND OF THE INVENTION

To transmit data by a wireless communications system, digital modulation techniques are involved to achieve high spectral efficiency and spectrum utilization. Amplifiers in base stations of a wireless communication system must be more linear as compared with counterpart amplifiers used for an analog transmission system. In the USA, the Federal Communications Commission, FCC, mandates certain limits for spectral regeneration. These limits are specified to be met with respect to certain requirements, such as, power used, the number of users per channel, and various other requirements. Not only must an amplifier satisfy the FCC requirements, an amplifier for wireless data communications must be linear over an extended range of input and output power.

Amplifiers are grouped by their operating characteristics into various classes. A Class A amplifier output device always conducts appreciable current corresponding with an input signal, and operates with good linearity, but loses efficiency due to high heat losses. Additionally, power dissipation occurs even without input power being supplied during dormant transmission moments. Such an amplifier is suitable for digital systems, but its use for data transmission is limited by its unacceptable low efficiency. A Class AB amplifier is turned on for a duration equal to or more than 180 degrees of its input signal cycle, and due to its short cycle time, attains a higher efficiency at a sacrifice of precise control of its linearity. Such an amplifier at a typical efficiency of 25% is suitable for use with a QPSK, Q-phase-shift keying, and a digital transmission system such as CDMA, code division multiple access transmission system.

According to known techniques, amplifier linearity is indicated by a graph depicting intermodulation power versus the output power of the amplifier. The intermodulation power results from distortion of the signal transferred by the amplifier. For a Class A amplifier the intermodulation power due to distortion directly increases with the power output of the amplifier. When graphed, such intermodulation power versus the power output is linear, and is depicted by an inclined, straight line, more or less. For a Class AB amplifier, a graph, indicating intermodulation power due to distortion versus output power, depicts a graphical line that visually reminiscent of an arc-tangent graphical line, with a central portion of the graphical line, in a narrow range, that is linear. A Class AB amplifier exhibits a desired linearity characteristic over the narrow range, which then degrades with both increased power and decreased power outside of the narrow range. Over an extended range of 20 dB, a variation in power of even a few dB is unacceptable. A problem to be solved is to provide an amplifier that has an optimum linearity over an extended range of output power, while retaining a high efficiency, and low intermodulation distortion. While the prior application to Vassilakis et al. has clear improvements in the linearity of a class AB amplifier by suitable adjustment of the bias to optimize linear performance accounting for temperature in input power, there is a need to optimize linearity for high power amplifiers (HPAs) over a prescribed frequency range.

SUMMARY OF THE INVENTION

According to the invention, an amplifier is provided with AGC, automatic gain control, based on output and input detected power levels and input frequency to provide an amplifier output with optimized high efficiency and high linearity over an extended range.

According to an embodiment, a microprocessor detects input power and output power of a two transistor, Class AB amplifier, and provides an adapted bias level of the transistors which has been adapted from detected input power. The gain of the amplifier is maintained by the microprocessor depending upon the detected input power and frequency as well as detected output power. For a two stage transistor, Class AB amplifier, the output becomes more linear than the voltage transfer characteristic of the individual transistors.

An object of the invention is to provide an amplifier with linear response and high efficiency by a microprocessor that maintains gain on the amplifier based on output and input detected power and frequency levels.

An amplifier configuration according to an embodiment of the invention dynamically changes a bias level of the transistors based on detected input power and frequency levels for optimum operation. The choice of using bias adaptation leads to having an output signal that is more linear than the individual transistor stages themselves. One stage of amplification is used to predistort the last stage with the result being that the output exhibits a characteristic suitable for digital modulation, for example, CDMA transmission. In a further embodiment of the invention of the present disclosure, a predistorter is used to further linearize the amplifier. The predistorter is used to distort the input signal such that the signal will then possess phase and gain characteristcs that are "opposite" to the distortion caused by the amplifier. Once this predistorted signal is applied to the amplifier, the combined output signal is linearized. The predistorter gain and phase response can be adjusted by varying the predistorter bias.

Use of dynamic bias adjustment for a Class AB transistor operation ensures greater linearity than that achievable with known Class AB operation, while having the benefit of higher efficiency operation. Higher dynamic range operation is achieved at low cost an low component count. Innovative software design allows maximum flexibility for alarm point setting, temperature optimization and manufacturing control. The adjustment of the bias level to account for changes in frequency which enables a more linear output at the output stage of the amplifier is described presently. The bias level (DC level) can be adjusted so that a more linear region of the transfer curve is used to effect a more linear output with respect to frequency. Accordingly, if there is change in the input frequency, adjustment of the DC bias level to an operating point in a more linear region of the transfer characteristic will result in a more linear output at the output stage of the amplifier.

The present invention envisions the use of a microcontroller and a non-volatile memory, for example EEPROM, which stores a lookup table of frequency versus optimum bias values with the capability of interpolation. Other factors such as input power level, temperature and voltage may also be used to optimize the bias as previously described in the parent application of the present invention.

An embodiment of the invention will now be described by way of example with reference to the accompanying drawings, according to which:

DESCRIPTION

Figure 1:
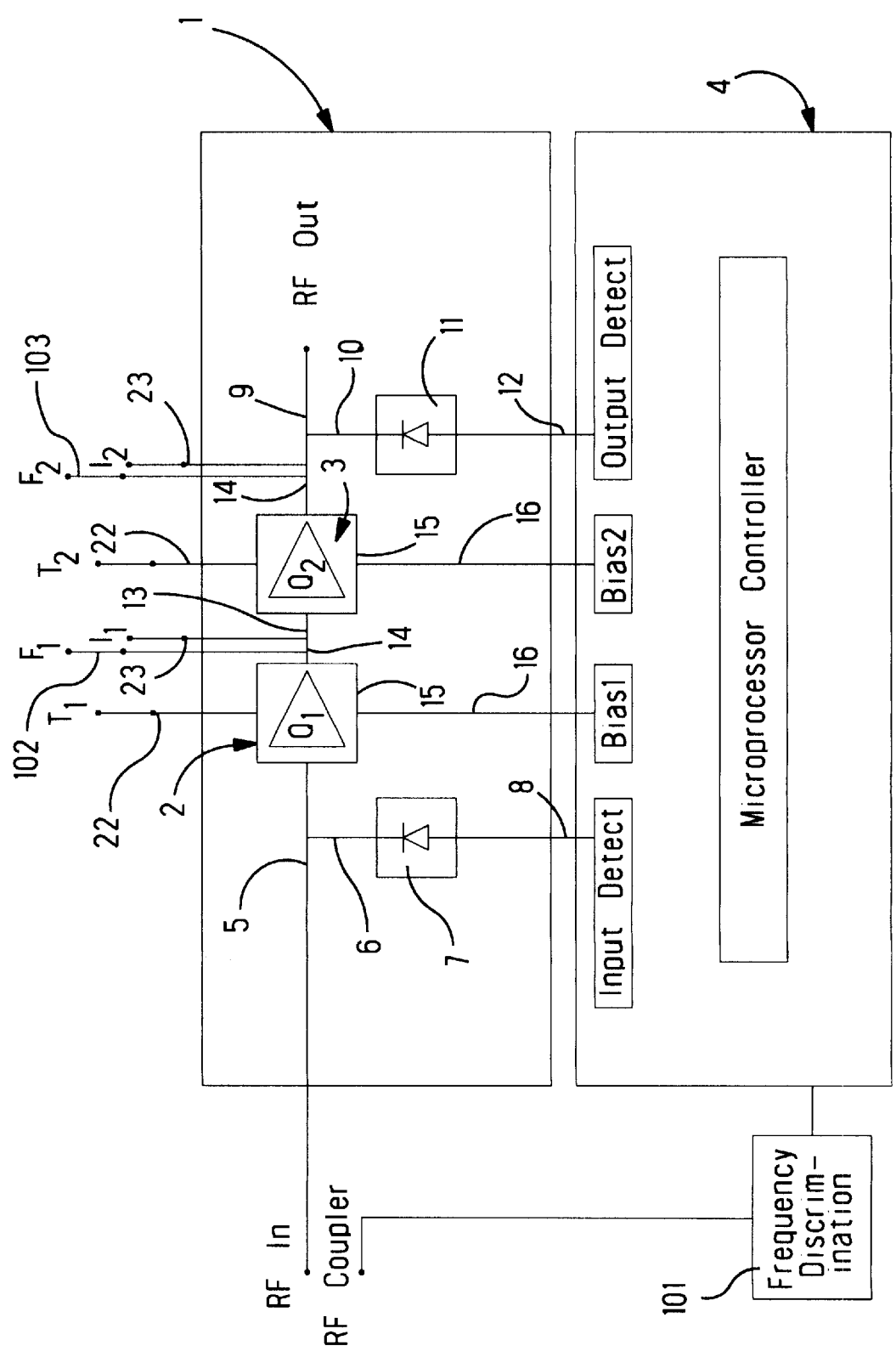
FIG. 1 is a schematic view of an amplifier.

With reference to FIG. 1, an amplifier (1) comprises a pair of transistors (2, 3) coupled together for a Class AB amplifier operation, together with a microprocessor controller (4). A Class AB amplifier is described by Gray, Paul R. and Meyer, Robert G., *Analysis And Design Of Analog Integrated Circuits,* Second Edition, 1977, 1984, John Wiley And Sons, New York, Pp. 326, 366, 755, 756., incorporated herein by reference. With reference to the amplifier 1, an RF input terminal (5) for receiving RF, radio frequency, signals is coupled to the input of a first transistor 2 of the transistors 2, 3. Detected input RF voltage is supplied over a first feed line monitor (6) from the input terminal 5, and through a back biased diode (7) to an input RF voltage terminal (8) of the microprocessor controller 4. An RF output terminal (9) of the amplifier 1 is coupled to the output of a second transistor 3 of the transistors 2, 3. Detected output RF voltage is supplied over a second feed line monitor (10) from the output terminal 9 through a back biased diode (11) to an input terminal (12) of the microprocessor controller 4, which input terminal 12 detects the output RF of the amplifier 1.

Each of the transistors 2, 3 comprises an emitter (13) and a collector (14) and a base (15). Base bias terminals (16) on respective bases 15 of the transistors 2, 3 are coupled to the microprocessor controller 2. Bias voltages on respective base bias terminals 16 are supplied as bias control voltages from the microprocessor controller 2. Depending on the detected input and output power levels and input frequency level, the bias points of the two Class AB stage transistors 2, 3 are adaptively changed to obtain a linearity of output RF voltage relative to input RF voltage, which linearity is greater than that of either of the single Class AB stage transistors 2, 3.

Figure 2:
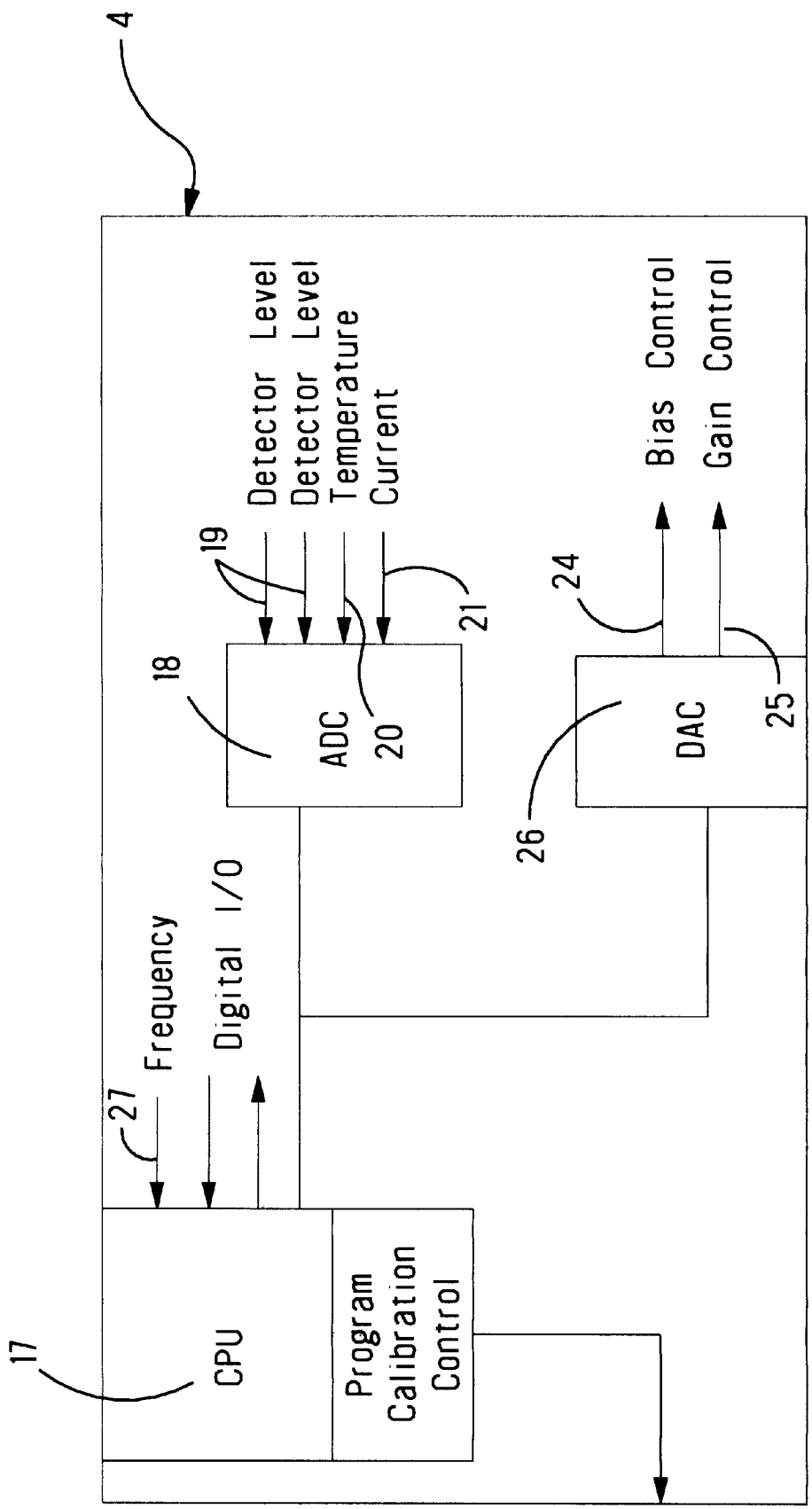
FIG. 2 is a schematic view of a central processor unit.

With reference to FIG. 2, the microprocessor controller 2 comprises, a Microchip PIC 16C73, obtained commercially from the suppler, named, Microchip Technologies, Inc., whose address is 2355 West Chandler, Chandler, Ariz. 88224 U.S.A. The microprocessor controller 2 is packaged in a 28 pin integrated circuit having an internal memory that stores programmed information, for example, information obtained from that which is recorded in control tables, of the type to be described hereafter.

With reference to FIG. 2, a CPU, central processor unit (17), of the microprocessor controller 2 monitors various operating parameters of the amplifier 1 by way of a multichannel ADC, analog to digital converter (18), whereby, the analog operating parameters of the amplifier 2 are sampled and converted to digital signals. These parameters include, input power level, output power level, temperature and current, all of which affect the voltage outputs of the transistors 2, 3. The main function of the microprocessor controller 2 is to provide automatic bias control adjustment of the transistors 2, 3 for maximum linearity. In particular, the microprocessor controller 2 comprises, the central processor unit 17 receiving signals from the analog to digital converter 18. The analog to digital converter 18 has various input terminals, for example, input power terminals (19) receiving detected input RF and detected output RF, and input temperature terminals (20), one of two of which is shown, receiving detected temperatures of respective transistors 2, 3, and input current terminals (21), one of two of which is shown, receiving detected currents of respective transistors 2, 3, one of two of which is shown. Additionally, there is an input terminal for the detected input frequency. With respect to FIG. 1, a temperature monitor (22) and a current monitor (23) are on each of the transistors 2, 3, which provide detected temperatures and detected currents to the corresponding input terminals 20, 21 of the analog to the digital converter 18.

In operation, the microprocessor controller 2 has been programmed with the information recorded in the control tables. The central processor unit 4 will compare the programmed information with detected information that is obtained by monitoring the monitors 6, 10, 22, 23,102,103 of the transistors 2, 3 during operation of the amplifier 1. The frequency monitors are shown as 102,103. Clearly in other configurations such as in FIG. 3, although not shown such monitors can be used. Output terminals (24, 25) of the central processor will supply bias control voltages to each of the transistors 2, 3 to control the gain of the transistors 2, 3. The voltages for bias control and gain control are supplied from the central processor unit through a digital to analog converter (26).

Linear operation of the amplifier 1 is desired, such that RF output power varies linearly with variations in input RF power. Each of the transistors 2, 3 operates in a nonlinear fashion, whereby, output power varies in a nonlinear manner with variations in input power. According to an embodiment of the amplifier 1, these variations in output power of each of the transistors 2, 3 can be measured over a range of measured input RF power and frequency. A table can be developed to indicate these measurements in output RF over a range of input measured RF power. Such a table is used as a control table for programming the central processor unit 17 of the microprocessor controller 2. Other measurements can be taken. For example, temperature can be monitored by the temperature monitors 22 on each of the transistors 2, 3. Current can be monitored by the current monitors 23 on each of the transistors 2, 3. The control table can be developed for programming the microprocessor unit 2 for cold, nominal and hot temperature operation of the transistors 2, 3.

As stated earlier, the DC bias level of an input signal having a particular frequency can be adjusted so that a more linear region of the transfer curve is used to effect a more linear output from the individual transistors of the present invention. The present invention envisions a frequency discriminator 101 shown in FIG. 1 which takes a portion of the RF input via an RF coupler in order to measure the frequency of the input signal. The frequency discriminator uses a prescaler, for example an NEC UPB1506. The output of the prescaler is further divided down so that it can be measured by the microprocessor. The frequency information is used to further optimize the bias for the best linear performance of the amplifier. To this end, the preferred frequency range is on the order of 1930–1990 MHz for the frequency selective bias scheme of the present disclosure. While this is the preferred range, it is of course the case that other frequency ranges within the purview of the ordinary artisan are possible. The frequency discriminator divides down the input frequency by a some factor and thereby down converts a signal for example at 1960 MHz to a signal in the order of 30 KHz. This must be done because the microcontroller 4 must have an input frequency which is at a lower frequency than the frequency of the microcontroller itself. The input frequency of 30 KHz corresponds as stated above to 1960 MHz and the PCS band. From this 30 KHz input level, a standard look-up in the memory of the microprocessor has a corresponding bias control which is based on the frequency of the input. To be clear, for a given frequency a predetermined input bias level is output to the transistors of the amplifier. In addition to the standard look-up in a non-volatile memory, the microprocessor can interpolate values of bias for frequencies between stored frequency values in the PCS band. This frequency input value is shown at 27 in FIG. 2.

The gain on each of the transistors 2, 3 is set by the microprocessor controller 2 supplying the bias control voltage on each of the transistors 2, 3 depending upon the detected RF power levels. The controller 2 sets an attenuator signal on each of the transistors 2, 3 by way of the DAC, digital to analog converter 24 to achieve the desired output power level.

If a table has been developed to program the microprocessor controller 2 to include the temperature measurements and the current measurements, the gain on the transistors 2, 3 can be set according to their monitored temperatures and currents, as the transistors 2, 3 are continuously monitored by the temperature monitors 22 and the current monitors 23.

Figure 3:
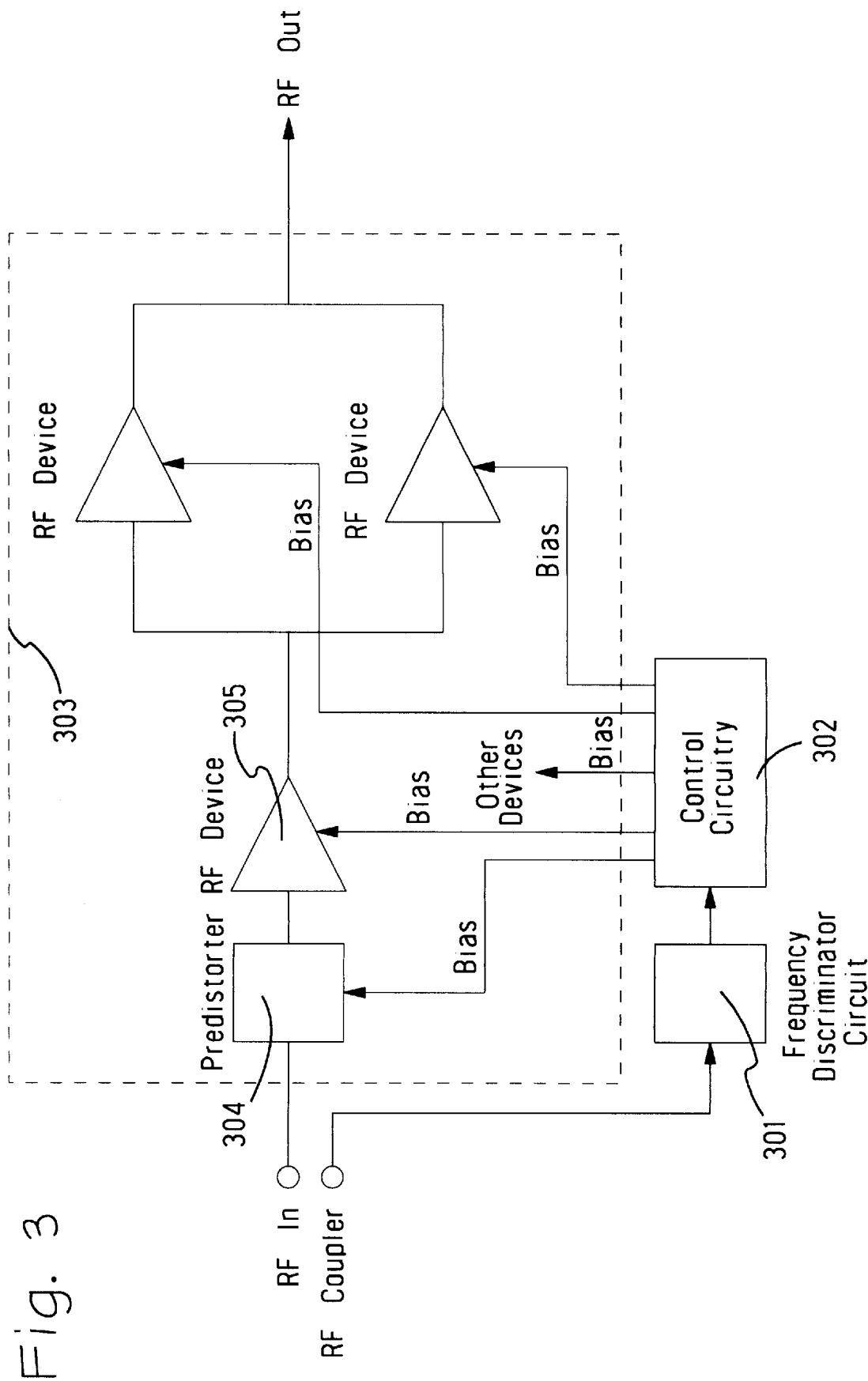
FIG. 3 is a schematic view of an amplifier having predistorter for high power amplifier applications.

FIG. 3 shows an RF amplifier 303 having a frequency discriminator circuit 301 and a control circuit 302 which is the control circuit shown in FIGS. 1 and 2 previously. The device shown in FIG. 3 has a predistorter 304 described previously. This predistorter 304 has a bias level input from a microcontroller 302 in order to change the predistorter response before it is applied to the amplifier 305 of FIG. 3. An RF transistor 305 accepts bias input from the microcontroller as is shown. The operation of the microcontroller 302 is virtually identical to that described in connection with FIGS. 1 and 2, with the addition of input bias to the predistorter 304.

Dynamic bias adjustment for class AB amplifiers has been described to improve the linearity of the amplifier by dynamically adjusting the bias of transistors and in one embodiment a predistorter by use of a microprocessor controller. The invention of the present disclosure adds a bias control input for the frequency of the RF signal in addition to the previously described adjustments in bias level for temperature and input and output power levels. Accordingly, the linearity of the class AB amplifier is improved and a higher dynamic range of operation is achieved. The invention having been described in detail, it is clear that various modifications to the above disclosure are within the purview of one of ordinary skill in the art. To the extent that such modifications and variations are obvious to one of ordinary skill in the art having had the benefit of the present disclosure, the improved linearity amplifiers that are within the purview of the ordinary skilled artisan are deemed within the scope of the present invention.

I claim:

1. An amplifier circuit, comprising:

an rf input of a given rf frequency, said rf input coupled to an rf coupler and a predistorter; a frequency discriminator connected to said rf coupler, said discriminator using a prescaler to divide down said rf frequency; a microcontroller connected to said discriminator, said microcontroller having a source of memory which has a bias voltage value corresponding to said rf frequency, and at least one output for supplying said bias voltage; and a predistorter connected to said at least one output of said microcontroller, said predistorter for improving linearity of an rf output of the amplifier circuit.

2. An amplifier as recited in claim 1, wherein said microcontroller further supplies said bias voltage to at least one transistor of the amplifier circuit.

3. An amplifier as recited in claim 1 further comprising a frequency monitor for monitoring an output frequency from said at least one of said transistors to enable comparing with programmed information with said output frequency.

* * * * *